United States Patent [19]

Natori et al.

[11] Patent Number: 5,024,264

[45] Date of Patent: * Jun. 18, 1991

[54] METHOD OF COOLING A SEMICONDUCTOR DEVICE WITH A COOLING UNIT, USING METAL SHERBET BETWEEN THE DEVICE AND THE COOLING UNIT

[75] Inventors: Katsuhide Natori, Yokohama; Isao Watanabe, Sagamihara; Koji Katsuyama, Yokohama; Isao Kawamura, Yokohama; Karuhiko Yamamoto, Yokohama; Takeshi Nagai, Yokohama, all of Japan

[73] Assignee: Fujitsu Limited, Kanagawa, Japan

[*] Notice: The portion of the term of this patent subsequent to May 7, 2008 has been disclaimed.

[21] Appl. No.: 348,370

[22] Filed: May 8, 1989

Related U.S. Application Data

[63] Continuation-in-part of Ser. No. 334,770, Apr. 10, 1989, which is a continuation of Ser. No. 106,842, Oct. 13, 1987, abandoned.

[30] Foreign Application Priority Data

Oct. 20, 1986 [JP] Japan .................. 61-248801

[51] Int. Cl.$^5$ .................. H05K 7/20; F28D 21/00
[52] U.S. Cl. .................. 165/1; 165/80.3; 165/80.4; 165/185; 357/82; 357/81; 420/555; 361/385; 361/386; 361/387
[58] Field of Search .................. 165/185, 80.3, 80.4, 165/1; 357/81, 82, 66, 67; 420/555, 557; 361/385, 386, 387

[56] References Cited

U.S. PATENT DOCUMENTS

| 4,639,829 | 1/1987 | Ostergren et al. | 165/185 X |
| 4,649,990 | 3/1987 | Kurihara et al. | 165/185 X |
| 4,682,566 | 7/1987 | Aitken | 165/80.4 X |
| 4,729,060 | 3/1988 | Yamamoto et al. | 357/92 X |
| 4,879,632 | 11/1989 | Yamamoto et al. | 165/185 |

OTHER PUBLICATIONS

W. J. Kleinfelder et al., "Liquid-Filled Bellows Heat Sink", vol. 21, No. 10, Mar. 1979, p. 4125, IBM TDB.
J. K. Hassan et al., "Chip Coding Employing a Comformable Alloy", vol. 24, No. 11A, Apr. 1982, p. 5595, IBM TDB.

*Primary Examiner*—Carl D. Price
*Attorney, Agent, or Firm*—Armstrong, Nikaido, Marmelstein, Kubovcik & Murray

[57] ABSTRACT

A method of cooling a device with a cooling unit, using a metal sherbet, which is metal being in a state of a two-phase composition consisting of a liquid phase and a solid phase, as a heat conducting body put between the cooling unit and the heat generating device for transferring heat generated in the device to the cooling unit. The metal sherbet is metal, such as an In-Ga binary system, in which solids of an In-Ga solid solution are dispersed in an In and Ga liquid at a temperature obtained under normal operations of the device and the cooling unit.

15 Claims, 7 Drawing Sheets

METHOD OF COOLING A SEMICONDUCTOR DEVICE WITH A COOLING UNIT, USING METAL SHERBET BETWEEN THE DEVICE AND THE COOLING UNIT

This application is a continuation-in-part of application Ser. No. 334,770, filed Apr. 10, 1989, pending which is a continuation of Ser. No. 106,842, filed Oct. 13, 1987, now abandoned.

BACKGROUND OF THE INVENTION

The present invention relates to a method for heat transfer such as cooling method for a semiconductor device, and more particularly, to a cooling method of using a metal sherbet, consisting of metal being in the state of a mixed phase or two-phase mixture of a liquid phase and a solid phase, as a heat conducting body disposed between a cooling unit and the heat source for transferring heat generated by the device to the cooling unit in high cooling efficiency.

Recently, to improve processing ability of an information processing system, respective sizes of the transistor devices used in the system have become extremely miniaturized. Accordingly, the size of each element of the semiconductor device is extremely miniaturized. In other words, a number of electronic elements mounted on the semiconductor device is tremendously increased as seen in an advanced semiconductor device such as an LSI (Large Scale Integration) device and a VLSI (Very Large Scale Integration) device. However, realizing a further reduction in size of the semiconductor device. In other words, realizing a higher packing density of the semiconductor device results in generating a large amount of heat from the semiconductor device. Accordingly, it has become impossible to keep an operating temperature of the semiconductor device in a maximum allowable in use, as long as a conventional air cooling method is used for cooling the semiconductor device. For example, the heating value per second of an LSI device is about 4 watts even in a maximum, and it increases up to as much as 10 watts in the case of a VLSI device. Therefore, to cool the semiconductor device, it has become necessary to employ a liquid cooling method in place of the conventional air cooling method.

Many kinds of liquid cooling units or structure have been practically used. For instance, FIG. 1 is a liquid cooling unit used for a flat package type semiconductor device, and FIG. 2 is liquid cooling structure used for a flip chip type semiconductor device. These liquid cooling unit and structure may be applied to any other types of semiconductor devices.

FIG. 1 indicates a mounting state of a liquid cooling unit 6 onto a flat package type semiconductor device 2 through an elastic heat conducing body 4 and a heat transferring plate 3 (made of, for example, alumina) equipped with the flat package type semiconductor device 2. The liquid cooling unit 6 comprises a cooling body 1, a bellows 5 made of metal or plastic, a heat conducting plate 9 connected to the bellows 5, a nozzle 7 and a water drain port 8. The heat conducting plate 9 is thermally connected with the heat transferring plate 3 through the elastic heat conducting body 4.

In FIG. 1, the nozzle 7 injects cooling water into a chamber formed by the bellows 5 for cooling the heat conducting plate 9 so that heat generated by the flat package type semiconductor device 2 is transferred to the cooling body 1, then the cooling water flows out from the water drain port 8 transferring heat from the heat conducting plate 9. Usually, the cooling temperature can be controlled by changing the temperature of the cooling water.

The elastic heat conducting body 4 is made of silicon rubber, in which a ceramic powder is mixed, for making the elastic heat conducting body 4 have an excellent heat conducting characteristic and good contact with both the heat conducting plate 9 and the heat transferring plate 3, using a pressure due to the elasticity of the bellows 5.

FIG. 2 indicates the structure for cooling a flip chip type semiconductor device 10 by utilizing a metal block (made of, for example, aluminum) 11 cooled by a cooling unit 13 which is also cooled by coolant flowing through a plurality of pipes 12 passing through the cooling unit 13. The cooing unit 13 has a recessed portion into which the metal block 11 is inserted pushing a coil spring 14. The metal block 11 has high heat conductivity and a smooth surface for making good contact with an inner wall surface of the recessed portion. The coil spring 14 is used to allow the metal block 11 to be placed in sufficient contact with the semiconductor device 10, with uniform pressure. The heat generated by the semiconductor device 10 is transferred to the cooling unit 13 through the metal block 11 The heat resistance appearing in gaps between the semiconductor device 10 and metal block 11 and between the metal block 11 and inner wall surface of the cooling unit 13 is reduced by using gas, such as helium, having good heat conduction, filled in the gaps and a space 20.

Many kinds of liquid cooling units have been used elsewhere, however considerably high heat resistance appears between the semiconductor device and the liquid cooing unit. Accordingly, in the prior art, the following methods have been proposed to lower the heat resistance:

1) depositing a soft metal (for example, indium or an indium alloy) into a contact portion intended to be thermally contacted, with pressure;

2) providing a liquid metal (for example, mercury) to the contact portion; and 3) soldering the contact portion.

However, in method 1), high thermal conductivity is difficult to achieve because the air layer always exists at a gap appearing in the contact portion. In method 2), there is always the danger of a short-circuit caused by flow of the liquid metal, because the liquid metal has low viscosity. In method 3), stress due to the difference in thermal expansion between the solder, the semiconductor device and the liquid cooling unit occurs, so that connecting structure around the contact portion is easily cracked when in operation and cooling is frequently performed.

Thus, the liquid cooling method is effective for cooling the semiconductor device, compared with the air cooling method. However, there is still a problem that a sufficient cooling effect is hard to be obtained because of large heat resistance appearing between the semiconductor device and the cooling unit, which has been a problem in the prior art.

A satellite flying in space is in a high vacuum, so that the temperature at the side of the satellite, facing the sun and that not facing the sun are quite different from each other. Therefore, making the temperature in the satellite uniform is very important for making components mounted in the satellite operate stably. As a result, the heat generated at the side facing the sun must be transferred to another side away from the sun. Furthermore, the components themselves generate heat respectively, so that such heat must be transferred to other places for keeping the temperatures of the components within allowable values. Usually, the heat of the components is transferred within the satellite and radiated into space, not directed toward the sun and the earth.

The satellite is fabricated by combining many structures, so that there are many fixed and rotatable mechanical joints in the construction of the structure. In these mechanical joints, the heat transfer which is carried out through these mechanical joints is very important, because the heat transferred through the structure is lost mostly at these mechanical joints. Therefore, how to reduce the heat transfer loss at the mechanical joints is a big problem in the manufacturing and operating of the satellite. To reduce the heat transfer loss at the mechanical joints, an organic material, such as silicon grease, optionally including metal and ceramic powder has been used. However, the organic material has the defect of being easily evaporated and changed in quality in a high vacuum so that the heat transfer loss of the material itself and at the contact to the mechanical structure increases.

SUMMARY OF THE INVENTION

An object of the present invention is to improve cooling effect of a semiconductor device such as an LSI and a VLSI device.

Another object of the present invention is to increase the packing density of a semiconductor device for realizing further accelerated development of the semiconductor devices.

Another object of the present invention is to contribute to realizing higher operating reliability of the semiconductor devices.

Still another object of the present invention is to provide a more efficient means for heat transfer in devices such as space satellites which are exposed to high radiant heat levels on one side and to extreme cold on another side.

The above objects of the present invention can be attained by employing a cooling method in which "metal sherbet" is used for a heat conducting body located between a cooling unit and the heat source, wherein, the metal sherbet is a metal being in a mixing state (two-phase state) of a solid phase and a liquid phase, such as, a mixture consisting of indium (In) and gallium (Ga).

In case of a binary system of Ga and In, when the weight percent of In is within a particular range, a two-phase mixture exists in a state of a highly viscous sherbet in which solids are dispersed in a liquid. In the present invention, such a two-phase mixture is used as the heat conducting body.

In accordance with applying the metal sherbet to the heat conducting body, a sufficient thermal contact between the semiconductor device and the cooling unit can be realized without using much pressure, and a very high cooling efficiency can be obtained because heat conductivity of the metal sherbet is excellent. That is, the heat resistance of the prior art (2.5° C./watt), in which the silicon rubber has been used, is improved to one-half that value by applying the present invention.

DESCRIPTION OF THE PREFERRED EMBODIMENTS

Figure 2:
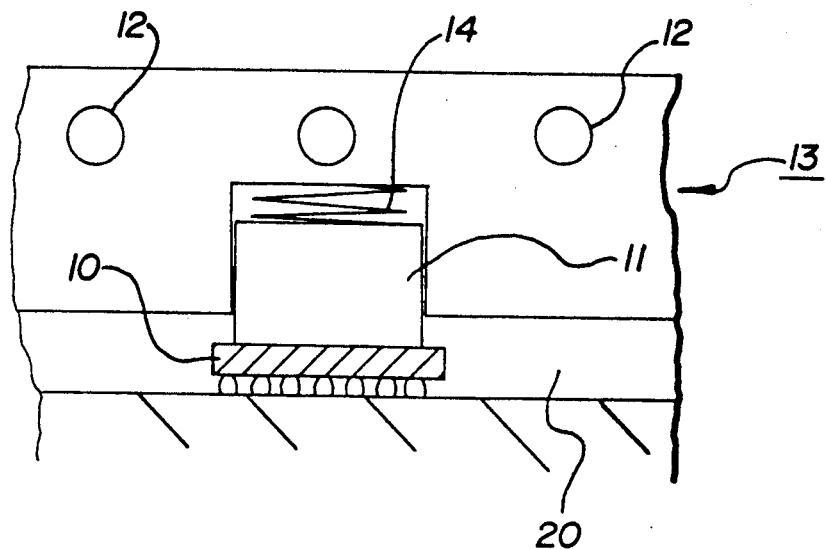
FIG. 2 is a sectional view of explaining the conventional liquid cooling unit for a flip chip type semiconductor device.

The present invention is adopted to cool a flip chip type semiconductor device as shown in FIG. 2.

Figure 3A:
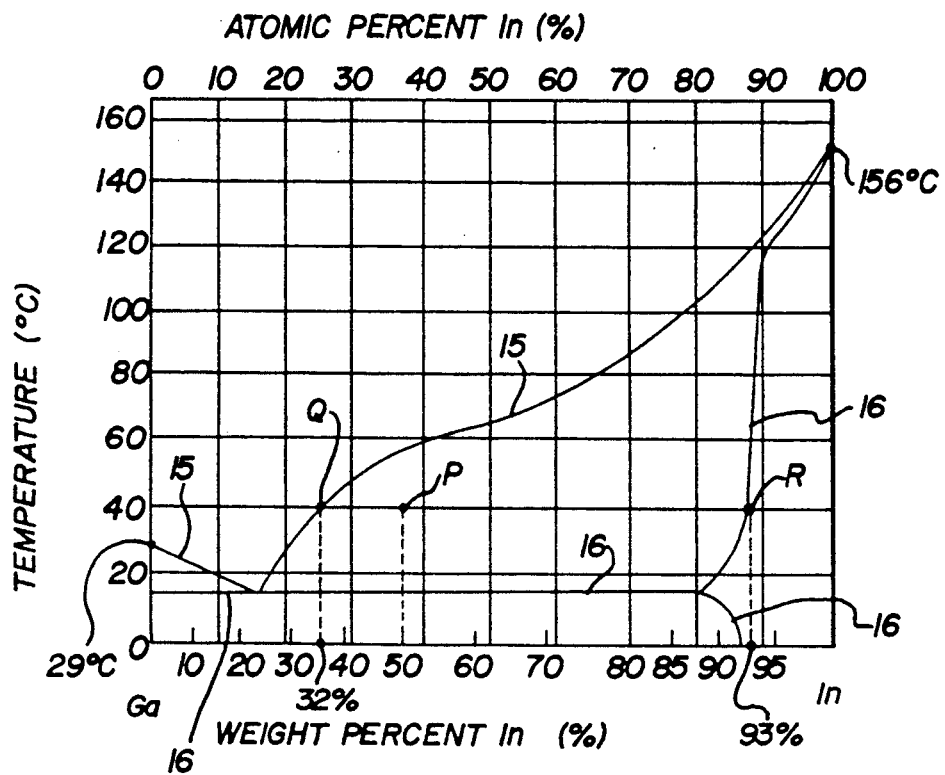
FIG. 3(a) is a phase diagram of an In-Ga binary system relating to the present invention.

FIG. 3(a) is a phase diagram of an In-Ga binary system. As indicated in the diagram, the melting point of In is approximately 156° C. and the melting point of Ga is approximately 29° C. In this system, a mixed phase, related to the present invention, of a liquid phase and a solid phase lies within a range of 24.5%–88% (weight percent) or 16.3%–81.7% (atomic percent) of In. Namely, the mixed phase region, in other words, a metal sherbet region in this disclosure, corresponds to a region enclosed by a liquidus line 15 and a solidus line 16. This metal sherbet region is well known to those skilled in the art, and particularly in academia, as the "two-phase field of liquid and solid." For instance, when the In-Ga binary system includes 50 weight percent of In under 40° C. of the temperature of the system, a point P is obtained in the sherbet region, points Q and R are obtained respectively by intersecting an X coordinate of 40° C. with the lines 15 and 16. Wherein, the point P indicates a total composition, R indicates the composition of a solid of In-Ga solid solution (which will be called simply "solid solution" hereinafter) and Q indicates the composition of an In and Ga liquid. From such points, P, Q and R, it can be said that this system has a component ratio of a solid to a liquid is equal to a ratio of length P-Q to P-R. When the semiconductor device normally operates under a normally cooled condition, the metal sherbet has a temperature at which the metal sherbet is in a state that the In-Ga solid solution is dispersed in an In and Ga liquid. A ratio of the In-Ga solid solution to the In and Ga liquid depends on a component ratio of In to Ga and the temperature of the In-Ga binary system, and a composition ratio of In to Ga in the In-Ga solid solution depends on the temperature. For instance, in FIG. 3(a), when the In weight percent decreases, an amount of dispersed In-Ga solid solution decreases. In other words, an amount of the In and Ga liquid increases.

When considering the temperature rise of a semiconductor device which normally operates under a normally cooled condition, a temperature range from 40° C. to 90° C. is enough for obtaining the metal sherbet in the In-Ga binary system. Incidentally, in FIG. 3(a), the line of 40° C. intersects with the lines 15 and 16 at the points Q and R respectively as mentioned before, and the In weight percent at the point Q is 32% and that at the point R is 93%.

Figure 4:
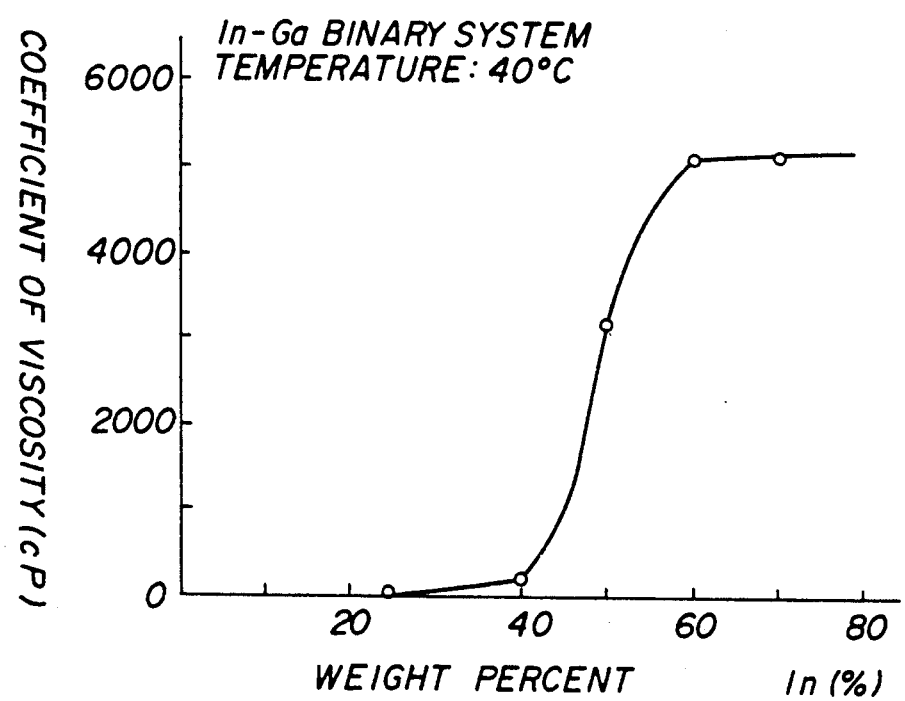
FIG. 4 is a graph indicating relation between weight percent of In and viscosity of an In-Ga binary system in the In-Ga binary system relating to the present invention.

FIG. 4 shows the relationship between the In weight percent and an In viscosity (units are centipoise or cP) in the In-Ga binary system at the temperature of 40° C. The viscosity is measured by a B type viscosimeter. From this figure, it will be understood that the viscosity is 3,000 cP or more when more than 50% weight percent In is present in the In-Ga binary system.

To achieve the present invention, it is preferable that the viscosity of the metal sherbet is more than 3,000 cP to avoid the metal sherbet flying out due to, for example, mechanical vibration.

Generally, the temperature of the semiconductor device rises to more than 40° C. in normal operation, so that, as shown in FIG. 4, the weight percent of In must be more than 50 for obtaining a viscosity of greater than 3,000 cP. Since the maximum allowable temperature of semiconductor device is approximately 80° C. when in operation, the weight percent of In must be less than 94, as shown in FIG. 4. From the above, for forming the mixture of the In-Ga solid solution and the In and Ga liquid, it can be concluded that the composition of In in the In-Ga binary system for this use is within 50 to 94 weight percents.

Figure 5A:
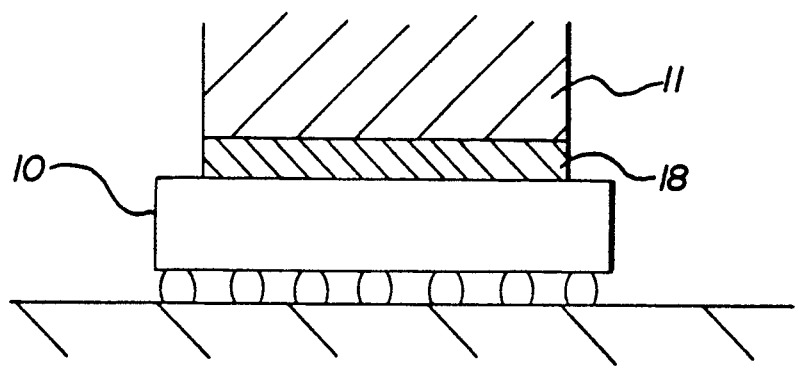
FIG. 5(a) is a sectional view of a flip chip type semiconductor device where a metal sherbet embodying the present invention is used.

FIG. 5(a) is a sectional view of a flip chip type semiconductor device using the metal sherbet of the present invention as the heat conducting body. The FIG. 5(a) corresponds to the prior art cooling structure shown in FIG. 2, and the same reference numerals as in FIG. 2 designate the same device or parts as in FIG. 2.

In FIG. 5(a), the semiconductor device 10 and the metal block 11 are thermally connected through a metal sherbet 18 having a high viscosity at a temperature obtained under normal operation of the semiconductor device 10 and the cooling unit 11. In this embodiment, the In-Ga binary system, having 80% weight percent of In, is used as the metal sherbet. The above In-Ga binary system shows a two-phase (solid and liquid phases) mixture in a temperature range of 15.7° C.-88° C. Applying such metal sherbet 18 to the heat conducting body, a sufficient heat connection can be obtained and there is no fear of a short circuit due to the lowered viscosity of a heat conducting body. Furthermore, lowering the thermal resistance can be realized in the same way as that performed by conventional soldering.

Figure 1:
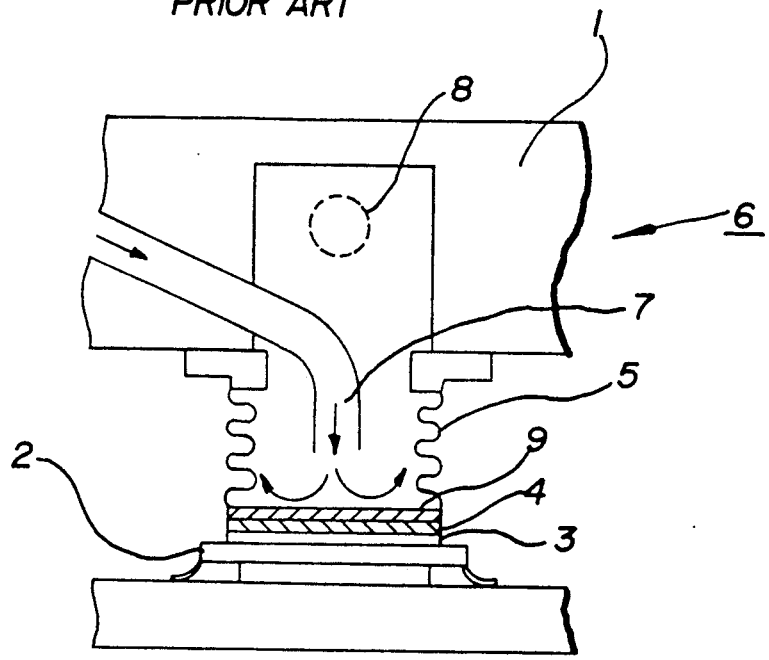
FIG. 1 is a sectional view of explaining a conventional liquid cooling unit for a flat package type semiconductor device.
Figure 5B:
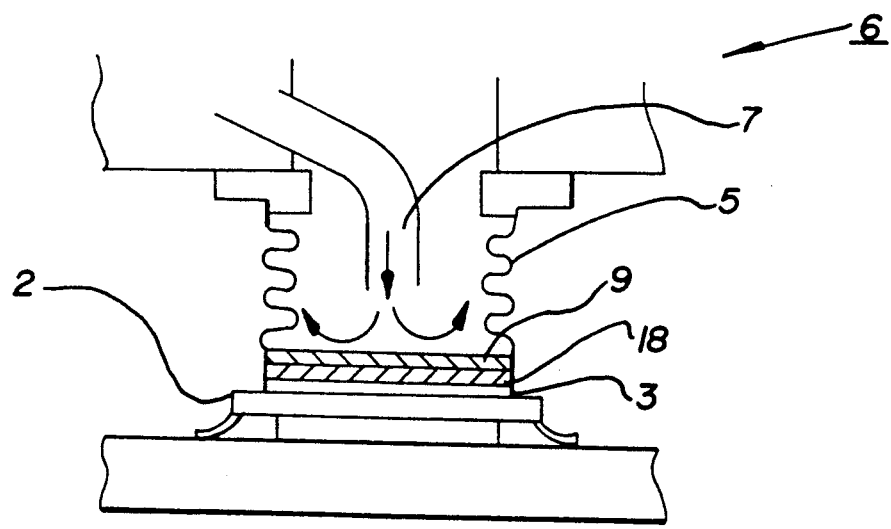
FIG. 5(b) is a sectional view of a flat package type semiconductor device where a metal sherbet embodying the present invention is used.

FIG. 5(b) is a sectional view where a flat package type semiconductor device 2 is cooled by using a liquid cooling unit 6 connected to the device 2 through a metal sherbet 18 of the present invention as the heat conducting body. This structure corresponds to the conventional structure indicated in FIG. 1, and the same reference numerals as in FIG. 1 designate the same unit or parts as in FIG. 1.

In FIG. 5(b), the connection between the heat transfer plate 3 attached to the flat package type semiconductor device 2 and the heat conducting plate 9 of the liquid cooling unit 6 having the bellows 5 is realized by using a metal sherbet 18 having a high viscosity at an operating temperature of the semiconductor device 2. The heat connection between the heat transferring plate 3 and the heat conducting plate 9 by the metal sherbet 18 can be perfectly performed as stated in the explanation referring to FIG. 5(a), so that there is no fear of a short-circuit due to the flow or leak from a heat conducting body having a low viscosity, and the thermal resistance also can be lowered.

As another embodiment, a Ga-Sn binary system can be used as a heat conducting body. In the Ga-Sn binary system, when the weight percent of Sn is designated to 20%-60%, the same effect as that obtained in case of the In-Ga binary system can be obtained.

Figure 3B:
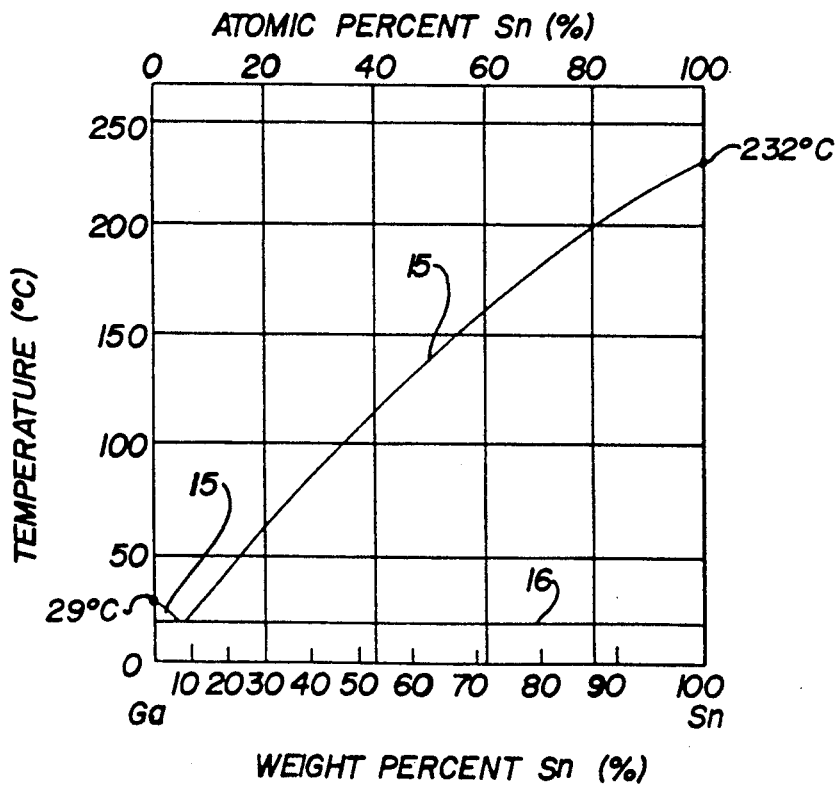
FIG. 3(b) is a phase diagram of a Ga-Sn binary system relating to the present invention.

FIG. 3(b) is a phase diagram of the Ga-Sn binary system. As indicated in the figure, the melting point of Sn is approximately 232° C. and the melting point of Ga is approximately 29° C. In FIG. 3(b), the region enclosed by the liquidus line 15 and the solidus line 16 is the metal sherbet region. In this metal sherbet region, the solids of Ga-Sn solid solution (which will be called "Ga-Sn solid solution" hereinafter) are dispersed in a Ga and Sn liquid so that a ratio of the Ga-Sn solid solution to the Ga and Sn liquid and the composition ratio of Ga to Sn depend on the component ratio of Ga to Sn in the metal sherbet and the temperature of the metal sherbet.

The relationship between weight percent of Sn and the viscosity (cP), which is measured using a B type viscosimeter, in the Ga-Sn binary system can be obtained similarly to the case of the In-Ga binary system shown in FIG. 4. When the weight percent of Sn is 20%-60% (more desirably 30%-45%) and that of Ga is 80%-40% (more desirably 70%-55%), the same effect as obtained in case of the In-Ga binary system can be obtained. That is, if the weight percent of Sn is less than 20%, the temperature range for allowing the Ga-Sn binary system to have a state of the mixture phase becomes narrow, and if the weight percent on Sn is more than 60%, the viscosity of the Ga-Sn binary system (metal sherbet) becomes so large that it would be hard to form the metal sherbet so as to uniformly attach to the metal block 11 and the semiconductor device 10 in case of cooling the flip chip type semiconductor device 10 as shown in FIG. 5(a) and to the heat transferring plate 3 and the heat conducting plate 9 in case of cooling flat package type semiconductor device as shown in FIG. 5(b).

In each of the phase diagrams [FIGS. 3(a) and 3(b)], it is preferable that a temperature difference between the liquidus line and the solidus line is large, because, in such case, the usable temperature range for the heat conducting body can be widened.

In FIGS. 5(a) and 5(b), the metal sherbet for the heat conducting body 18 is formed by the following steps, when, for example, the In-Ga binary system is applied to the heat conducting body 18: 1) providing a first In-Ga solid solution having, for example, 75.5% (weight) of Ga and 24.5% (weight) of In; wherein, the first In-Ga solid solution is in a liquid phase at a room temperature; 2) wetting the surfaces, to be connected, of the semiconductor device and the cooling unit with the first In-Ga solid solution; 3) providing a second In-Ga solid solution according to this invention and which is in a state of mixed phase when its temperature rises up to, for example, 40° C.; wherein, the temperature 40° C. is selected by considering the desired cooling condition of the semiconductor device; 4) putting the semiconductor device and the cooling unit in an atmosphere having a temperature of 40° C.; 5) dropping a proper amount of the second In-Ga solid solution on the wet surfaces of the semiconductor device and the cooling unit, so that the drop of the invented In-Ga solid solution is naturally spread over the surfaces; 6) connecting the surfaces to each other; and 7) taking the semiconductor device and the cooling unit, connected to each other, out from the heated atmosphere and putting them in a normal atmosphere which is at room temperature.

Thus, the In-Ga and Ga-Sn binary systems may be used as the metal sherbet. However, other multinary metal systems such as a ternary system substantially including respectively In and Ga or Ga and Sn can also be used as the metal sherbet.

Not only to the flat package type semiconductor device or the flip chip type one but also to other type semiconductor devices, the cooling method of the present invention can be applied as long as a liquid cooling unit is used. The cooling method of the present invention can also be applied to other liquid cooling systems for cooling devices other than the semiconductor devices, which is illustrated by explaining the metal sherbet as applied to the heat transfer structure used in a space satellite, in reference to FIGS. 6(a) to 6(d), 7(a) and 7(b).

In this embodiment, the present invention is used as the heat conductive body (metal sherbet) of an In-Ga or Sn-Ga alloy in a state of metal sherbet, that is, in a state of a two-phase field of liquid and solid uniformly throughout the body, in the mechanical joints instead of the usual organic material, e.g., silicon grease. Because the metal sherbet has the features of having a very small heat resistance, an excellent mechanical contact with the mechanical structure so as to have very small heat loss and a very low vapor pressure (less than $10^{-32}$ Torr when the metal sherbet is made of In and Ga and less than $10^{-36}$ Torr when the metal sherbet is made of Sn and Ga). In particular, the feature of having a very low vapor pressure is very important for using the metal sherbet in an orbiting satellite. In the above, whether the heat conductive body is in the state of a metal sherbet or not depends on the temperature of the heat conductive body. As is well known, the temperature of a substance in space is extremely low when the substance is in a shadow of the sun. However, the temperature of the heat conducting body can be kept in a proper value for maintaining the heat conducting body in the sherbet state even though the body is in space, because the temperature of the heat conducting body is raised by the heat source to which the heat conducting body is attached, and if necessary, the temperature can be raised for by using another heating means automatically if it is required, in the satellite.

Figure 6A:
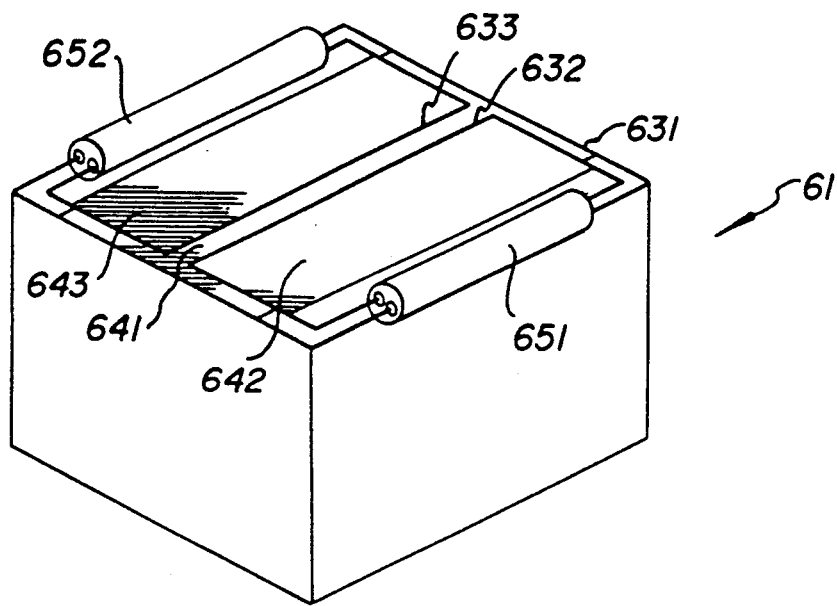
FIG. 6(a) is a perspective view of a heat radiation unit equipped in a satellite, showing heat radiation panels provided on the heat radiation unit and which are in the closed position.
Figure 6B:
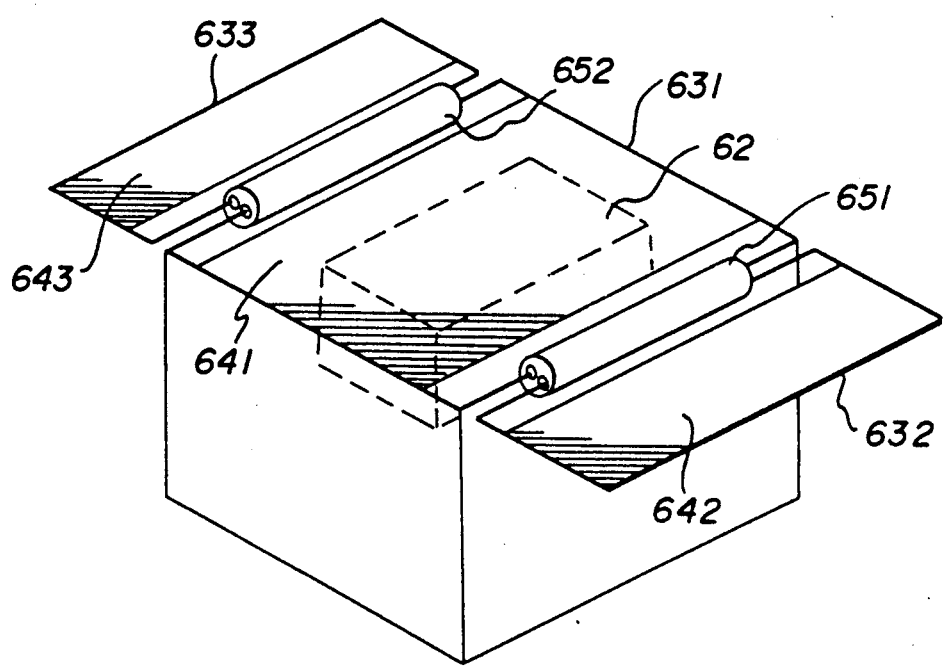
FIG. 6(b) is a perspective view of the heat radiation unit, showing the heat radiation panels folded out.
Figure 6C:
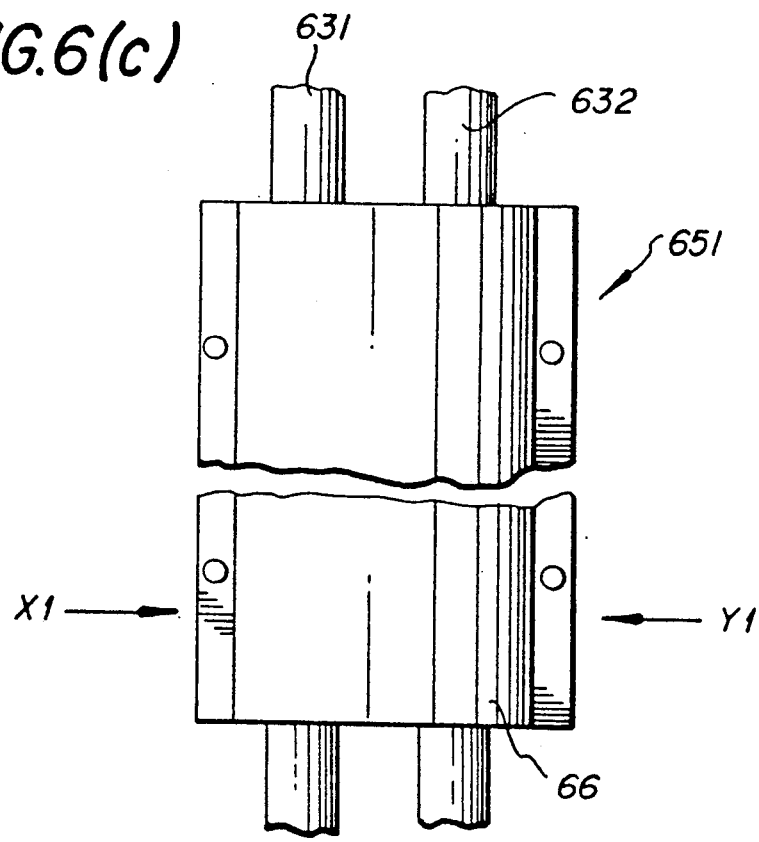
FIG. 6(c) is a plan view of a rotatable mechanical joint used in the heat radiation unit.
Figure 6D:
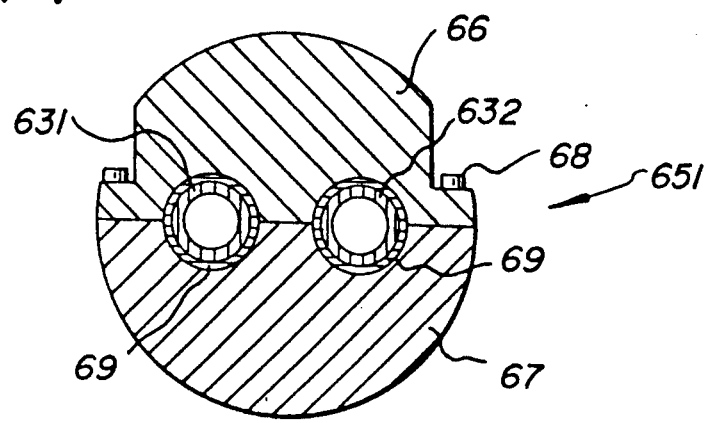
FIG. 6(d) is a sectional side view of the rotatable mechanical joint, showing that the rotatable mechanical joint uses metal sherbet.

FIGS. 6(a) to 6(d) show the application of the metal sherbet to rotatable mechanical joints used in the satellite. Through FIGS. 6(a) to 6(d), the same number designates the same unit or part. FIGS. 6(a) and 6(b) show the perspective views of a heat radiation unit 61 respectively, for radiating heat generated from a heat source 62 such as electric devices located in the heat radiation unit 61. In FIGS. 6(a) and 6(b), thick solid lines indicate heat pipes 631, 632 and 633 forming three square frames in which heat radiation panels 641, 642 and 643 are provided respectively. In the heat radiation unit 61, the heat radiation panel 641 only mechanically touches the heat source 62 as shown in FIG. 6(b). Therefore, the heat transferred to the panel 641 from the heat source 62 is radiated to space by the panel 641. However, the satellite must be fabricated to be compact, so that the heat radiation panel is usually divided and the divided panels are folded out when the satellite is set in space. In this embodiment, the heat radiation panel is divided into three panels 641, 642 and 643 as described above, and the three panels are folded out as shown in FIG. 6(b). When the three panels are folded out thusly, two rotatable mechanical joints 651 and 652 are needed and the heat must be transferred from the heat pipe 631 to the heat pipes 632 and 633 through the rotatable mechanical joints 651 and 652 respectively, as shown in FIG. 6(b). The details of the rotatable mechanical joints 651 (or 652) is shown in FIGS. 6(c) and 6(d) respectively. In FIGS. 6(c) and 6(d), a unit or part having the same number as in FIGS. 6(a) and 6(b) designates the same unit or part as in FIGS. 6(a) and 6(b). FIG. 6(c) shows a plan view of the rotatable mechanical joint 651 for mechanically connecting the heat pipes 631 and 632 so as to have good heat contact between them. FIG. 6(d) is a sectional side view at a line X1-Y1 in FIG. 6(c). As shown in FIG. 6(d), the joint 651 is constructed by joining an upper block 66 and a lower block 67 using fasteners 68, holding the heat pipes 631 and 632 separately, inserting a metal sherbet 69 between the heat pipes (631 and 632) of the rotatable mechanical joint 651, respectively. Inserting the metal sherbet 69, the heat at the pipe 631 can be transferred to the heat pipe 632 through the metal sherbet 69 and the rotatable mechanical joint 651, and the heat at the heat pipe 632 is radiated to space from the radiation panel 642 attached to the heat pipe 632 as shown in FIG. 6(b).

Figure 7A:
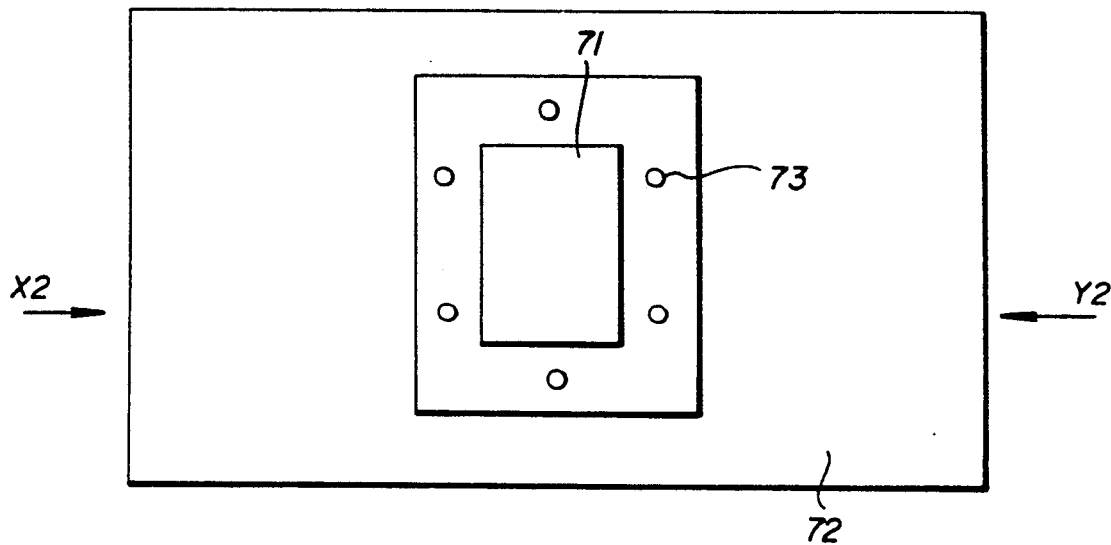
FIG. 7(a) is a plan view of a heat block mounted on a metal chassis.
Figure 7B:
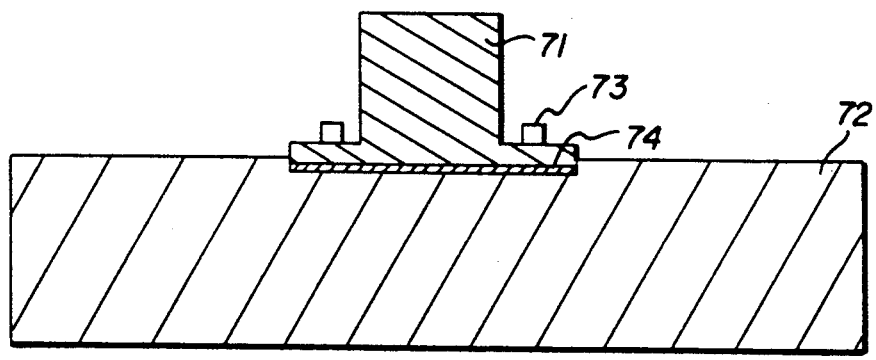
FIG. 7(b) is a sectional side view of the heat block of FIG. 7(a) mounted on the metal chassis through the metal sherbet.

FIGS. 7(a) and 7(b) show another embodiment of he present invention, wherein the metal sherbet is applied in a fixed mechanical joint, in the satellite. The fixed mechanical joint is used to connect a heat block, including a heat source such as an electric part, with a metal chassis used as a heat sink. FIG. 7(a) is a plan view of a heat block 71 mounted on a meal chassis 72. FIG. 7(b) is a sectional side view at a line X2-Y2 in FIG. 7(a). As shown in FIG. 7(b), the heat block 71 is mounted on the metal chassis 72 by fasteners 73, through a metal sherbet 74. By using the metal sherbet 74, the heat resistance at the mechanical joint between the heat block 71 and the metal chassis 72 can be reduced significantly and the heat transfer can be performed effectively, even in a perfect vacuum.

We claim:

1. In a method for cooling a substance to be cooled, by using heat transfer means, the improvement comprising the use of a heat conducting body being in a two-phase state of liquid and solid uniformly throughout the body at a temperature of said substance and disposed between said substance and the heat transfer means, said heat conducting body having a coefficient of viscosity greater then 3,000 centipoise at the operating temperature of said substance.

2. A method according to claim 1, wherein said heat conducting body consists essentially of 50–94 weight % indium and 50–6 weight % gallium.

3. A method according to claim 1, wherein said heat conducting body consists essentially of 20–60 weight % tin and 80–40 weight % gallium.

4. A method of cooling a heat generating substance, used in a space vehicle, by transferring heat from the heat generating substance to another, fixed substance having high heat conductivity, said method comprising the steps of:
using a fixed mechanical joint for mechanically jointing the heat generating substance and the fixed substance; and
using a heat conducting body, which is a mixture comprising 50 to 94 weight percent indium and the balance gallium which is in a state of a two-phase field of liquid and solid uniformly throughout the body, in the fixed mechanical joint so as to be disposed substantially between the heat generating substance and the fixed substance.

5. A method according to claim 4, wherein said heat conducting body has coefficient of viscosity greater than 3,000 centipoise at a temperature less than 40° C. in a vacuum.

6. A method according to claim 4, wherein said heat conducting body has a vapor pressure less than $10^{-32}$ Torr in a perfect vacuum.

7. A method of cooling a heat generating substance, used in space, by transferring heat from the heat generating substance to another fixed substance having high heat conductivity, said method comprising the steps of:
using a fixed mechanical joint for mechanically jointing the heat generating substance and the fixed substance; and
using a heat conducting body, which is a mixture comprising 20 to 60 weight percent tin and the balance gallium which is in a state of a two-phase field of liquid and solid uniformly throughout the body, in the fixed mechanical joint so as to be disposed substantially between the heat generating substance and the fixed substance.

8. A method according to claim 7, wherein said heat conducting body has a coefficient of viscosity greater than 3,000 centipoise at a temperature less than 40° C. in a vacuum circumstances.

9. A method according to claim 7, wherein said heat conducting body has a vapor pressure less than $10^{-36}$ Torr in a perfect vacuum.

10. A method of cooling a heat generating substance, used in a space vehicle, by transferring heat from the heat generating substance to a rotatable substance, having high heat conductivity, said method comprising the steps of:
using a rotatable mechanical joint for mechanically jointing the heat generating substance and the rotatable substance; and
using a heat conducting body, which is a mixture comprising 50 to 94 percent indium and the balance gallium and which is in a state of two-phase field of liquid and solid uniformly throughout the body, in the rotatable mechanical joints so as to be disposed substantially between the heat generating substance and the rotatable substance.

11. A method according to claim 10, wherein said heat conducting body has coefficient or viscosity greater than 3,000 centipoise at a temperature less than 40° C. in a vacuum.

12. A method according to claim 10, wherein said heat conducting body has a vapor pressure less than $10^{-32}$ Torr in a perfect vacuum.

13. A method of cooling a heat generating substance, used in a space vehicle, by transferring heat from the heat generating substance to a rotatable fixed substance, having high heat conductivity, said method comprising the steps of:
using a rotatable mechanical joint for mechanically jointing the heat generating substance and the rotatable substance; and
using a heat conducting body, being a mixture comprising 20 to 60 weight percent tin and the balance gallium and which is in a state of a two-phase field of liquid and solid uniformly throughout the body, in the rotatable mechanical joint so as to be disposed substantially between the heat generating substance and the rotatable substance.

14. A method according to claim 13, wherein said heat conducting body has a coefficient of viscosity greater than 3,000 centipoise at a temperature less than 40° C. in a vacuum.

15. A method according to claim 13, wherein said heat conducting body has a vapor pressure less than $10^{-36}$ Torr in a perfect vacuum.

* * * * *

UNITED STATES PATENT AND TRADEMARK OFFICE
CERTIFICATE OF CORRECTION

PATENT NO. : 5,024,264
DATED : June 18, 1991
INVENTOR(S) : NATORI et al

It is certified that error appears in the above-identified patent and that said Letters Patent is hereby corrected as shown below:

On the title page, Item [75], "Karuhiko", should read -- Haruhiko --.

Signed and Sealed this

Twentieth Day of October, 1992

Attest:

DOUGLAS B. COMER

*Attesting Officer*     *Acting Commissioner of Patents and Trademarks*